United States Patent [19]
Gardner et al.

[11] Patent Number: 6,140,677
[45] Date of Patent: Oct. 31, 2000

[54] SEMICONDUCTOR TOPOGRAPHY FOR A HIGH SPEED MOSFET HAVING AN ULTRA NARROW GATE

[75] Inventors: Mark I. Gardner, Cedar Creek; Frederick N. Hause, Austin, both of Tex.

[73] Assignee: Advanced Micro Devices, Inc., Sunnyvale, Calif.

[21] Appl. No.: 09/105,656

[22] Filed: Jun. 26, 1998

[51] Int. Cl.[7] .............................. H01L 29/76; H01L 29/94; H01L 31/113; H01L 31/119
[52] U.S. Cl. ........................... 257/327; 257/368; 257/344; 257/382; 257/408; 438/197; 438/701; 438/673
[58] Field of Search ..................................... 257/368, 344, 257/327, 382, 408; 438/197, 303, 701, 673, 951

[56] References Cited

U.S. PATENT DOCUMENTS

| | | | |
|---|---|---|---|
| 3,924,265 | 12/1975 | Rodgers | 357/23 |
| 3,975,221 | 8/1976 | Rodgers | 148/191 |
| 4,145,459 | 3/1979 | Goel | 427/88 |
| 4,250,519 | 2/1981 | Mogi et al. | 257/41 |
| 4,638,400 | 1/1987 | Brown et al. | 361/304 |
| 4,949,136 | 8/1990 | Jain | 357/23.3 |
| 4,963,501 | 10/1990 | Ryan et al. | 437/40 |
| 5,448,094 | 9/1995 | Hsu | 257/330 |
| 5,453,635 | 9/1995 | Hsu et al. | 257/336 |
| 5,596,215 | 1/1997 | Huang | 257/344 |
| 5,679,968 | 10/1997 | Smayling et al. | 257/213 |
| 5,776,821 | 7/1998 | Haskell et al. | 438/585 |
| 5,834,816 | 11/1998 | Jang | 257/382 |
| 5,854,501 | 12/1998 | Kao | 257/316 |

FOREIGN PATENT DOCUMENTS

| | | |
|---|---|---|
| 1-189172 | 7/1989 | Japan . |
| 2-262375 | 10/1990 | Japan . |
| 5-21789 | 1/1993 | Japan . |

*Primary Examiner*—Tom Thomas
*Assistant Examiner*—Douglas W. Owens
*Attorney, Agent, or Firm*—Kevin L. Daffer; Conley, Rose & Tayon

[57] ABSTRACT

A semiconductor topography for a transistor having an ultra-narrow gate conductor. A method for forming the semiconductor topography may include etching a patterning layer extending across a conductive gate layer to form an opening extending to an upper surface of the conductive gate layer. Subsequently, a masking layer is formed upon the exposed upper surface of the conductive gate layer. The patterning layer and portions of the conductive gate layer not shielded by the masking layer are then removed to form a gate conductor. Lightly doped drain impurity areas may then be formed in the semiconductor substrate aligned with sidewall surfaces of the gate conductor. In an embodiment, spacers may be formed adjacent sidewall surfaces of the gate conductor substantially simultaneously with removal of the masking layer and portions of a gate dielectric layer not shielded by the gate conductor. Source and drain impurity areas may then be formed in the semiconductor substrate aligned with sidewall surfaces of the spacers. A metal silicide may be formed upon upper surfaces of the gate conductor and the source and drain areas.

15 Claims, 9 Drawing Sheets ically reaction. The photoresist is washed with a solvent that preferentially removes resist areas of higher solubility. Exposed portions of the polysilicon material not protected by photoresist are etched away, defining the geometric shape of a polysilicon gate conductor.

SEMICONDUCTOR TOPOGRAPHY FOR A HIGH SPEED MOSFET HAVING AN ULTRA NARROW GATE

BACKGROUND OF THE INVENTION

1. Field of the Invention

This invention relates to integrated circuit fabrication and, more particularly, to forming a transistor having an ultra-narrow gate. By forming a trench having opposed sidewalls which approach each other as they pass from an upper surface of a patterning layer formed upon a conductive gate layer to an upper surface of the conductive gate layer, a gate conductor can be formed with a width much smaller than the width of gate conductors formed using conventional photolithography techniques.

2. Description of the Relevant Art

Fabrication of a MOSFET device is well known. Generally speaking, MOSFETs are manufactured by placing an undoped polycrystalline silicon ("polysilicon") material over a relatively thin gate oxide arranged above a semiconductor substrate. The polysilicon material and the gate oxide are patterned to form a gate conductor with source/drain regions (i.e., junctions) adjacent to and on opposite sides of the gate conductor within the substrate. The gate conductor and source/drain regions are then implanted with an impurity dopant. If the dopant species employed for forming the source/drain regions is n-type, then the resulting MOSFET is an NMOSFET (n-channel) transistor device. Conversely, if the source/drain dopant species is p-type, then the resulting MOSFET is a PMOSFET (p-channel) transistor device. Integrated circuits utilize either n-channel devices exclusively, p-channel devices exclusively, or a combination of both on a single monolithic substrate.

Because of the increased desire to build faster and more complex integrated circuits, it has become necessary to reduce the transistor threshold voltage, $V_T$. Several factors contribute to $V_T$, one of which is the effective channel length ("$L_{eff}$") of the transistor. The initial distance between the source-side junction and the drain-side junction of a transistor is often referred to as the physical channel length. However, after implantation and subsequent diffusion of the junctions, the actual distance between junctions becomes less than the physical channel length and is often referred to as the effective channel length. In VLSI designs, as the physical channel length decreases, so too must the $L_{eff}$. Decreasing $L_{eff}$ reduces the distance between the depletion regions associated with the source and drain of a transistor. As a result, less gate charge is required to invert the channel of a transistor having a shorter $L_{eff}$. Accordingly, reducing the physical channel length, and hence the $L_{eff}$, can lead to a reduction in the threshold voltage of a transistor. Consequently, the switching speed of the logic gates of an integrated circuit employing transistors with reduced $L_{eff}$ is faster, allowing the integrated circuit to quickly transition between logic states (i.e., operate at high frequencies).

Unfortunately, minimizing the physical channel length of a transistor is somewhat limited by conventional techniques used to define the gate conductor of the transistor. As mentioned earlier, the gate conductor is typically formed from a polysilicon material. A technique known as lithography is used to pattern a photosensitive film (i.e., photoresist) above the polysilicon material. An optical image is transferred to the photoresist by projecting a form of radiation, typically ultraviolet light, through the transparent portions of a mask plate. The solubility of photoresist regions exposed to the radiation is altered by a photochemi- The lateral width (i.e., the distance between opposed sidewall surfaces) of the gate conductor, which dictates the physical channel length of a transistor, is thus defined by the lateral width of an overlying photoresist layer. The minimum lateral dimension that can be achieved for a patterned photoresist layer is unfortunately limited by, inter alia, the resolution of the optical system (i.e., aligner or printer) used to project the image onto the photoresist. The term "resolution" describes the ability of an optical system to distinguish closely spaced objects. Diffraction effects may undesirably occur as the radiation passes through slit-like transparent regions of the mask plate, scattering the radiation and therefore adversely affecting the resolution of the optical system. As such, the features patterned upon a masking plate may be skewed, enlarged, shortened, or otherwise incorrectly printed onto the photoresist.

In most core logic areas of an integrated circuit there are numerous logic gates (e.g., NAND and NOR gates) and interconnection between those gates. While reducing the $L_{eff}$ of each gate conductor within a logic gate increases the operational frequency and the integration density of an integrated circuit, other factors must also be manipulated to maximize circuit complexity and speed. For example, the spacing between series-connected transistors within a multiple-input logic gate must be decreased to provide for high packing density and high-speed operation of the logic gate. Unfortunately, the minimum definable dimension of lithography mandates the spacing between the gate conductors. The geometric shape of the gate conductors is generally defined by lithographically patterning photoresist over regions of a gate conductor material to be retained for the gate conductors. The minimum distance between portions of the photoresist patterned over the gate conductor material is limited by the constraints of lithography. Therefore, the lateral width of each region of the gate conductor material etched to form the gate conductors cannot be reduced below, e.g., 0.2 micron. As such, the minimum spacing between gate conductors within a logic gate is sacrificed by the conventional procedure of using lithography to pattern the gate conductors.

It would therefore be desirable to develop a transistor fabrication technique in which the channel length of the transistor is reduced to provide for high-frequency operation of an integrated circuit employing the transistor. More specifically, a process is needed in which the channel length is no longer dictated by the resolution of a lithography optical aligner. A process which avoids the limitations of lithographic exposure used for defining opposed sidewall surfaces (i.e., boundaries) of conventional gate conductors would beneficially allow the channel length, and hence the $L_{eff}$, of a transistor to be scaled with higher resolution and potentially to a smaller size. Minimizing and/or providing accurate control over $L_{eff}$ of a transistor would advantageously allow a designer to more closely design for specified operational parameters, such as speed at which the transistor switches between its on and off states.

SUMMARY OF THE INVENTION

The problems outlined above are in large part solved by the technique hereof for forming an ultra-narrow gate conductor. In an embodiment, a patterning layer is formed upon a conductive gate layer from which the gate conductor is to be formed. A photoresist layer is then formed upon the patterning layer. A window is formed through the photoresist layer to expose an upper surface of the patterning layer. The window is created using optical lithography and an etch technique. As such, the minimum width of the window is limited in size. An opening is then formed through the patterning layer to expose an upper surface of the conductive gate layer.

In one embodiment, the patterning layer includes silicon nitride ("nitride") and the conductive gate layer includes polycrystalline silicon ("polysilicon"). After etching a window through the photoresist layer, a select portion of the patterning layer not covered by the photoresist is etched to form an opening. The sidewalls of the opening are purposefully formed such that they are non-perpendicular to the horizontal surface of the patterning layer (hereinafter "slanted"). A plasma etch technique in which carbon becomes deposited upon the substrate surface as it is being etched may be used to form the slanted sidewalls of the opening. The plasma used for the etch is preferably provided with $O_2$ and a fluorocarbon. Examples of suitable fluorocarbon etchants include $C_2F_6$, $CH_4$, $CHF_3$, and $C_3F_8$. The anisotropic nature of the plasma etch results in more frequent ion bombardment of horizontally oriented surfaces than vertically oriented surfaces. The addition of $O_2$ to the plasma increases the etch rate of the patterning layer by allowing C radicals to react with O-containing radicals to form volatile compounds (e.g., CO and $CO_2$) and thus free up F radicals to react with the patterning layer.

The amount of $O_2$ added to the plasma is, however, kept at a minimum to ensure that a substantial portion of the C radicals created in the plasma remain free to adsorb onto the patterning layer, where they may form a nonvolatile film. The nonvolatile film preferably serves as a "passivant" in that it protects the topological surface upon which it resides from exposure to species, such as ions. Ion bombardment of the passivant residing upon horizontally oriented surfaces removes the passivant to permit excited F atoms to be adsorbed upon the underlying surface of the patterning layer. Absent significant ion ablation of vertically oriented surfaces, the C passivant remains laterally adjacent the lateral boundaries of the patterning layer, above the edges of the exposed portion of the conductive gate layer. As such, the F atoms are only allowed to absorb upon the mid-region of the patterning layer interposed between those edges covered by the C passivant. As the absorbed F atoms are bombarded by ions, they react to form volatile species, so that the mid-region of the patterning layer is etched. As the mid-region is etched, vertical sidewall surfaces are formed in the patterning layer upon which the C passivant can accumulate. Therefore, as the etch progresses, the amount of patterning layer remaining uncovered by the C passivant decreases, and the sidewalls of the resulting opening become slanted.

Subsequent to forming the opening within the patterning layer, a masking layer may be formed upon the exposed upper surface of the conductive gate layer. In an embodiment in which the conductive gate layer includes polysilicon, the masking layer preferably includes thermally grown silicon dioxide. The unetched portions of the patterning layer residing upon the horizontal upper surface of the silicon-based conductive gate layer preferably serve as barriers to oxygen and thus prevent the growth of oxide upon unexposed portions of the upper surface of the conductive gate layer. Thereafter, the pattering layer and portions of the conductive gate layer not shielded by the masking layer may be removed using, e.g., an anisotropic plasma etch, to form a gate conductor.

According to one embodiment, the masking layer and portions of the gate dielectric layer not shielded by the gate conductor are removed using, e.g., an anisotropic plasma etch. A lightly doped drain ("LDD") implant is then self-aligned to the lateral boundaries of the opposed sidewall surfaces of the gate conductor. In this manner, LDD areas are formed within the semiconductor substrate proximate the gate conductor. Sidewall spacers may then be formed adjacent the sidewall surfaces of the gate conductor, as is well known in the art, and source and drain implant areas may be formed self-aligned to the opposed sidewalls of the spacers. A refractory metal may then be deposited upon upper surfaces of semiconductor substrate above the source and drain impurity areas and upon the upper surface of the gate conductor and reacted to form metal silicide layers.

In an alternative embodiment, lightly doped drain implant areas may be formed in the semiconductor substrate prior to removal of the masking layer and the gate dielectric material. A spacer material may then be deposited across the gate dielectric material, the gate conductor, and the masking layer. In an embodiment in which the spacer material has etch characteristics substantially similar to the etch characteristics of the masking layer and the gate dielectric material (e.g., if the spacer material, the masking layer, and the gate dielectric material all include silicon dioxide), the masking layer and portions of the gate dielectric material not shielded by the gate conductor may be removed substantially simultaneously with formation of the sidewall spacers adjacent the gate conductor. Source and drain implant areas may be formed aligned with sidewall surfaces of the spacers. Metal silicide layers may then be formed upon upper surfaces of the semiconductor substrate above the source and drain impurity areas and upon the gate conductor.

In an embodiment in which the spacer material has etch characteristics substantially different from the etch characteristics of the masking layer and the gate dielectric material, the masking layer and portions of the gate dielectric material not shielded by the gate conductor may be removed substantially simultaneously with formation of the sidewall spacers adjacent the gate conductor. For example, if the spacer material includes silicon nitride, while the masking layer and the gate dielectric material include silicon dioxide, the spacer material may be selectively removed to form the spacers, while the masking layer and the gate dielectric layer are substantially retained. Source and drain implant areas may be formed aligned with sidewall surfaces of the spacers, followed by removal of the masking layer and removal of the gate dielectric material from areas of the semiconductor substrate not shielded by the gate conductor and the spacers.

Alternatively, the source and drain implant areas may be formed following, rather than prior to, removal of the masking layer and portions of the gate dielectric material. In either embodiment, the spacers will preferably be "composite" spacers including layers of dissimilar materials (e.g., a layer of silicon nitride arranged upon a layer of silicon dioxide). Metal silicide layers may then be formed upon upper surfaces of the semiconductor substrate above, the source and drain impurity areas and upon the gate conductor.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

BRIEF DESCRIPTION OF THE DRAWINGS

Other objects and advantages of the invention will become apparent upon reading the following detailed description and upon reference to the accompanying drawings in which.

Figure 1:
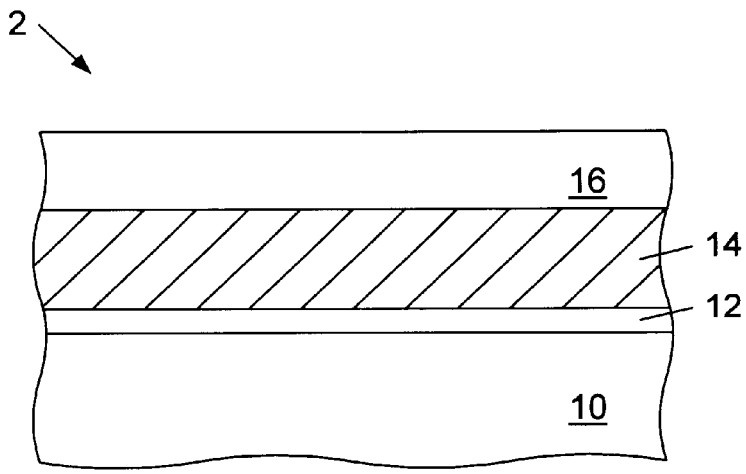
FIG. 1 is a partial cross-sectional view of a semiconductor topography, including, in order, a gate dielectric layer, a conductive gate layer, and a patterning layer formed upon a semiconductor substrate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE INVENTION

Turning now to FIG. 1, a partial cross-sectional view of a semiconductor topography 2 is depicted. Semiconductor substrate 10 preferably includes single crystalline silicon that has been slightly doped with n-type or p-type impurities. Dielectric isolation regions (not shown) may be arranged spaced distances apart within substrate 10 for dielectrically isolating ensuing active areas. In an alternate embodiment, p-type and n-type wells may be arranged within select regions of substrate 10 to allow for the formation of a CMOS integrated circuit that includes both NMOSFET and PMOSFET transistors. As depicted in FIG. 1, gate dielectric layer 12 is formed across semiconductor substrate 10 using, e.g., CVD of silicon dioxide from a silane- and oxygen-bearing gas. Alternatively, gate dielectric layer 12 may be thermally grown silicon dioxide. In yet another alternative embodiment, gate dielectric layer 12 may include a material having a dielectric constant substantially greater than the dielectric constant of silicon dioxide (i.e., a "high-K" dielectric). A layer of conductive gate material may then formed upon gate dielectric layer 12. Preferably, conductive gate material 14 includes polycrystalline silicon ("polysilicon") chemical-vapor deposited from, e.g., a silane source to a depth of approximately 1000–1800 angstroms. Patterning layer 16 may then be formed upon an upper surface of conductive gate layer 14. Pattering layer 16 may include, e.g., silicon nitride chemical vapor deposited from a silane- and ammonia-bearing gas to a depth of approximately 500–900 angstroms.

Figure 2:
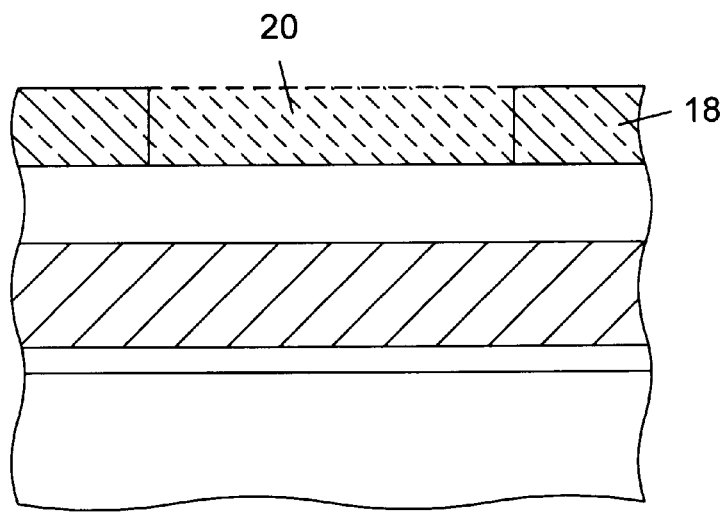
FIG. 2 is a partial cross-sectional view of the semiconductor topography subsequent to the step in FIG. 1, wherein a photoresist layer having a window patterned therein is formed upon the patterning layer.

As shown in FIG. 2, photoresist layer 18 has been deposited across patterning layer 16. Portions of photoresist layer 18 (shown in phantom) have been selectively patterned and removed to form window 20 extending through photoresist layer 18 to an upper surface of pattering layer 16. In a preferred embodiment, window 20 has a width of approximately 0.2 μm (i.e., the minimum definable dimension of lithography).

Figure 3:
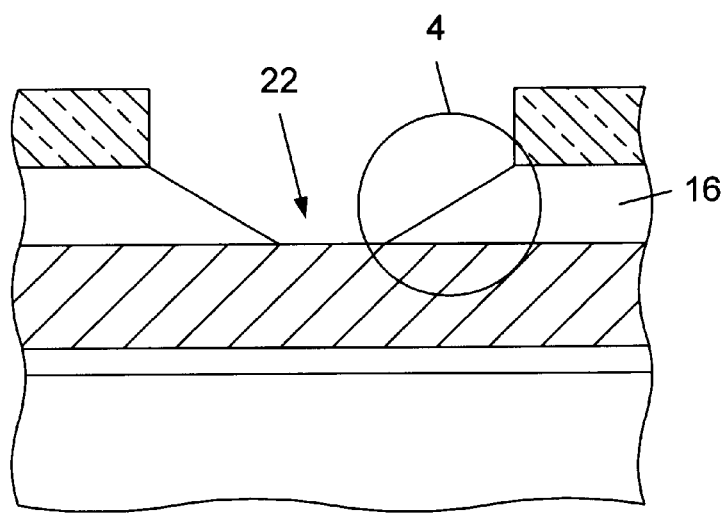
FIG. 3 is a partial cross-sectional view of the semiconductor topography subsequent to the step in FIG. 2, wherein portions of the patterning layer are etched to define an opening therein.
Figure 4:
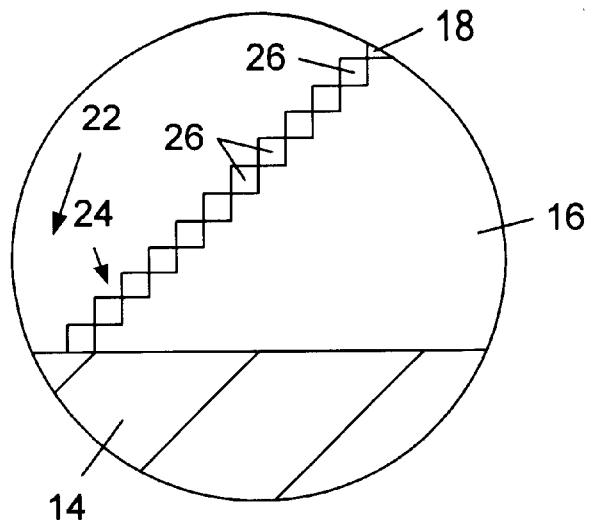
FIG. 4 is an expanded view of a portion of the semiconductor topography depicted in FIG. 3.

Turning to FIG. 3, portions of patterning layer 16 have been etched to form an opening 22 within patterning layer 16. Opening 22 may be formed by anisotropically etching patterning layer 16 using a plasma provided with $O_2$ and a fluorocarbon (e.g., $C_2F_6$, $CH_4$, $CHF_3$, or $C_3F_8$). A carbon passivant may be deposited upon the exposed portions of patterning layer 16 during the anisotropic etch. However, since the passivant is continuously removed from horizontally oriented surfaces, it is allowed to build up only on vertically oriented surfaces. FIG. 4 illustrates a detailed view along section 4 of FIG. 3. Sidewall 24 of opening 22 is shaped somewhat like a staircase. Carbon passivant 26 is allowed to accumulate upon the vertical sidewalls of each "stair" as the etch progresses. As a result of the anisotropic etch, the opposed sidewalls of opening 22 are formed at an angle relative to the upper surfaces of the patterning layer and the conductive gate layer, such that a width of opening 22 is less proximate the upper surface of the conductive gate layer than proximate the upper surface of the patterning layer. Preferably, the width of opening 22 proximate the upper surface of conductive gate layer 14 is approximately 0.04–0.1 μm.

Figure 5:
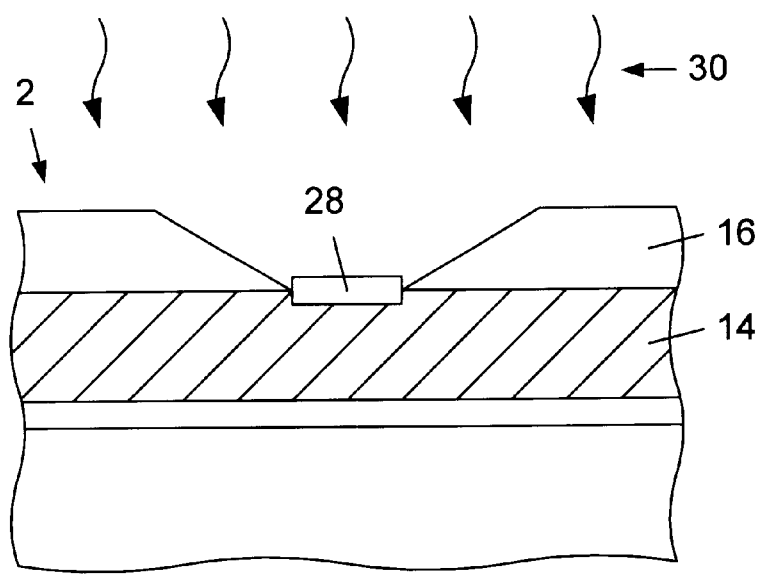
FIG. 5 is a partial cross-sectional view of the semiconductor topography subsequent to the step in FIG. 3, wherein a masking layer is formed upon an upper surface of the conductive gate layer between sidewalls of the opening in the patterning layer.
Figure 6:
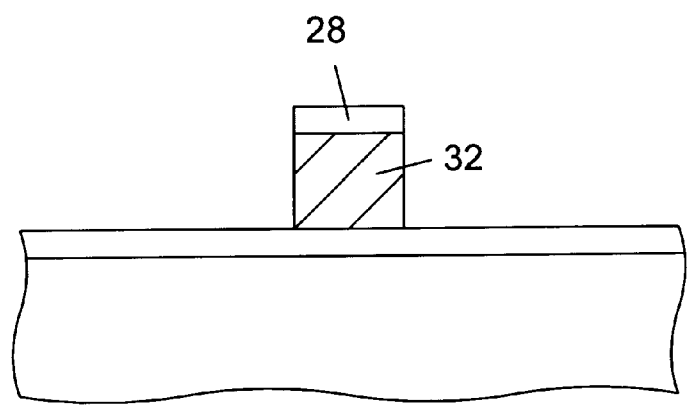
FIG. 6 is a partial cross-sectional view of the semiconductor topography subsequent to the step in FIG. 5, wherein the photoresist layer, the patterning layer, and portion of the conductive gate layer not shielded by the masking layer are anisotropically etched to form a gate conductor upon the gate dielectric layer.

Turning now to FIG. 5, a masking layer 28 is formed upon the exposed upper surface of conductive gate layer 14. Preferably, conductive gate layer 14 includes polysilicon. As such, masking layer 28 may include silicon dioxide thermally grown upon the exposed upper surface of conductive gate layer 14. Masking layer 28 may be formed by, e.g., exposing conductive gate layer 14 to thermal radiation 30 while placing semiconductor topography 2 in an oxygen-bearing ambient. Radiation 30 may be supplied from an annealing furnace or a rapid thermal anneal ("RTA") chamber. Patterning layer 16 preferably substantially inhibits ambient oxygen from penetrating to and oxidizing underlying regions of conductive gate layer 14. Following formation of masking layer 28, an anisotropic etch may be used to remove patterning layer 16 and portions of conductive gate layer 14 not shielded by masking layer 28 to form gate conductor 32, as shown in FIG. 6. As depicted in FIG. 5, the photoresist layer has been removed prior to formation of the masking layer. Alternatively, the photoresist layer may be retained upon patterning layer 16 during formation of the masking layer and removed during the subsequent etch step.

Figure 7:
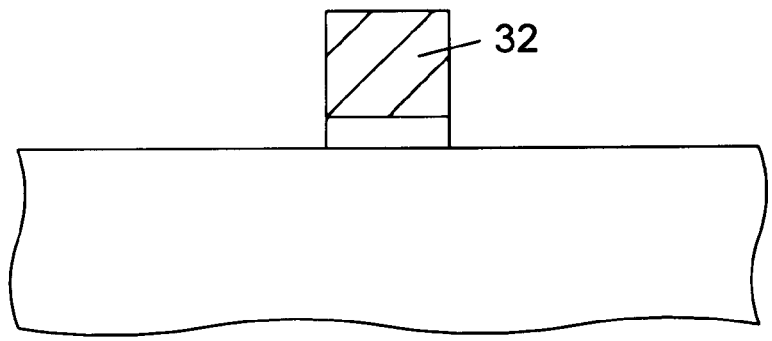
FIG. 7 is a partial cross-sectional view of the semiconductor topography subsequent to the step of FIG. 6, wherein the masking layer and portions of the gate dielectric layer not shielded by the gate conductor are removed.
Figure 8:
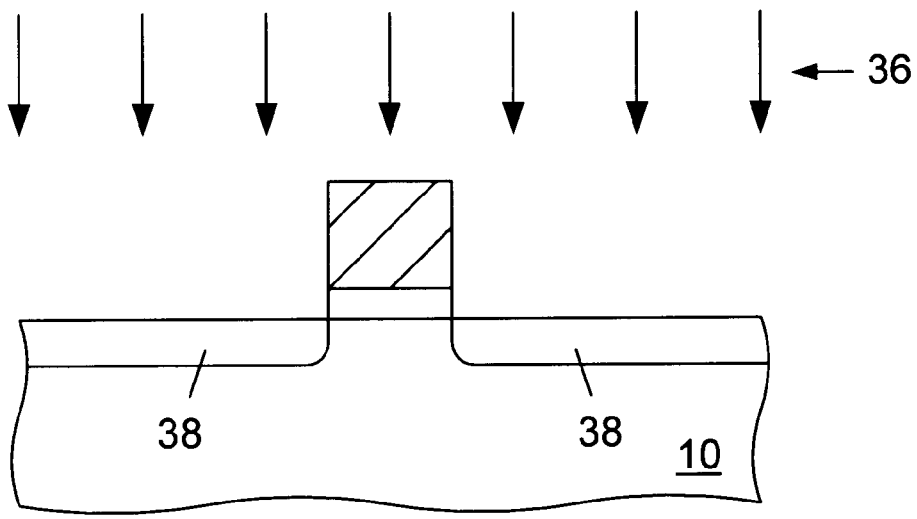
FIG. 8 is a partial cross-sectional view of the semiconductor topography subsequent to the step of FIG. 7, wherein dopant species are implanted into the substrate to form lightly doped drain impurity areas aligned with sidewall surfaces of the gate conductor.

According to one embodiment of the present invention, masking layer 28 and portions of gate dielectric layer 12 not masked by the gate conductor are removed using an isotropic etch, as depicted in FIG. 7. Gate dielectric material retained beneath gate conductor 32 forms gate dielectric 34. A lightly doped drain ("LDD") implant 36 that is self-aligned to the opposed sidewall surfaces of gate conductor 32 may then be forwarded into substrate 10 at a relatively low concentration and energy. LDD areas 38 having a relatively shallow depth are thus formed proximate the upper surface of substrate 10.

Figure 9:
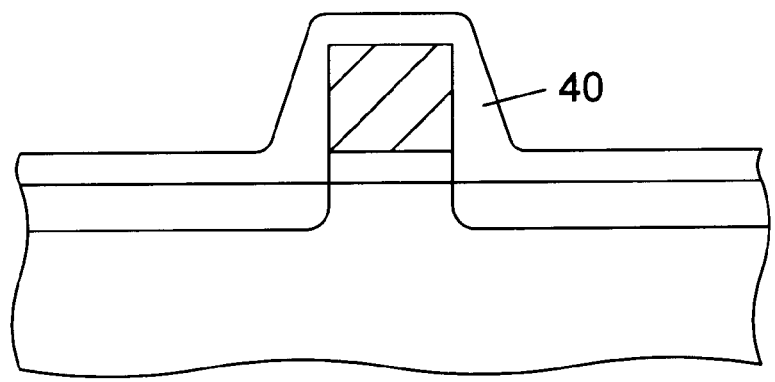
FIG. 9 is a partial cross-sectional view of the semiconductor topography subsequent to the step of FIG. 8, wherein a spacer material layer is deposited across the semiconductor topography.
Figure 10:
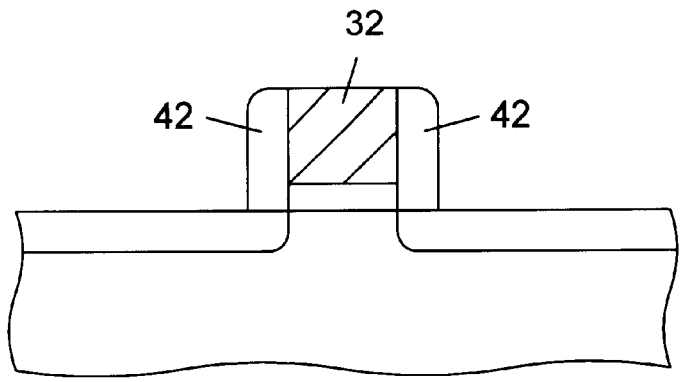
FIG. 10 is a partial cross-sectional view of the semiconductor topography subsequent to the step in FIG. 9, wherein sidewall spacers are formed upon opposed sidewall surfaces of the gate conductor.
Figure 11:
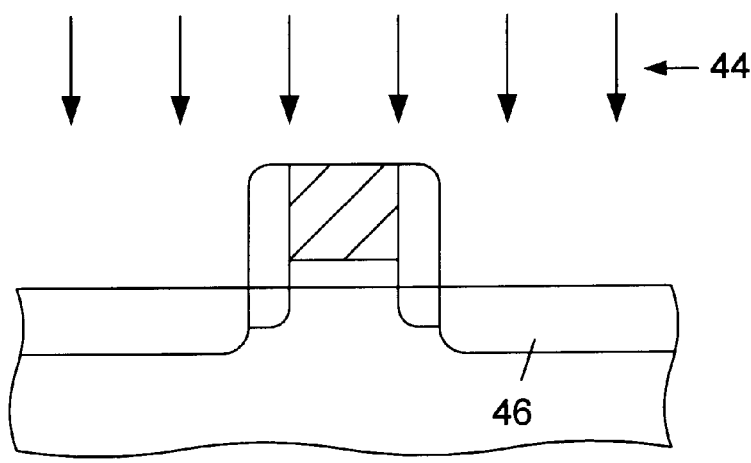
FIG. 11 is a partial cross-sectional view of the semiconductor topography subsequent to the step in FIG. 10, wherein another implant of dopant species which is self-aligned to the exposed lateral surfaces of the sidewall spacers is forwarded into the substrate to form source and drain impurity regions.
Figure 12:
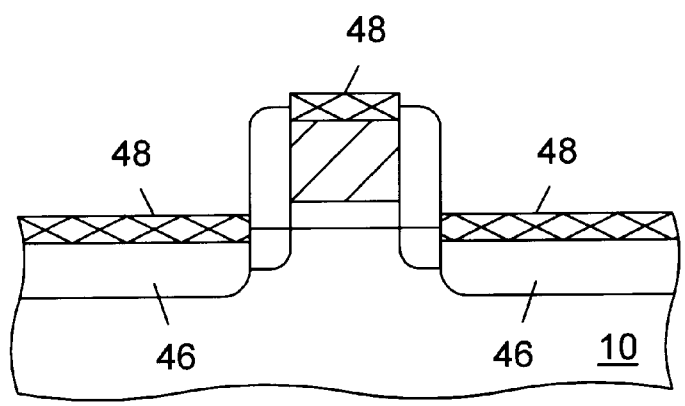
FIG. 12 is a partial cross-sectional view of the semiconductor topography subsequent to the step in FIG. 11, wherein metal silicide has been formed upon upper surfaces of the source and drain regions and the gate conductor.

Turning to FIG. 9, a dielectric material 40 (e.g., oxide or nitride) may then be deposited across the semiconductor topography. Dielectric material 40 may then be anisotropically etched to remove a portion of the dielectric material from horizontally oriented surfaces while retaining spacers 42 upon lateral surfaces of gate conductor 32, as shown in FIG. 10. Dopant species 44 may then be implanted at a relatively high dose and energy into portions of semiconductor substrate 10 not masked by the gate conductor or the spacers to form source and drain impurity areas 46, as depicted in FIG. 11. In an embodiment, a post-implant anneal using thermal radiation may be performed to activate and position the as-implanted impurities. As depicted in FIG. 12, self-aligned silicide "salicide" structures 48 have been formed upon source and drain regions 46 by reacting a refractory metal, e.g., titanium or cobalt, with the silicon surfaces of substrate 10.

Figure 13:
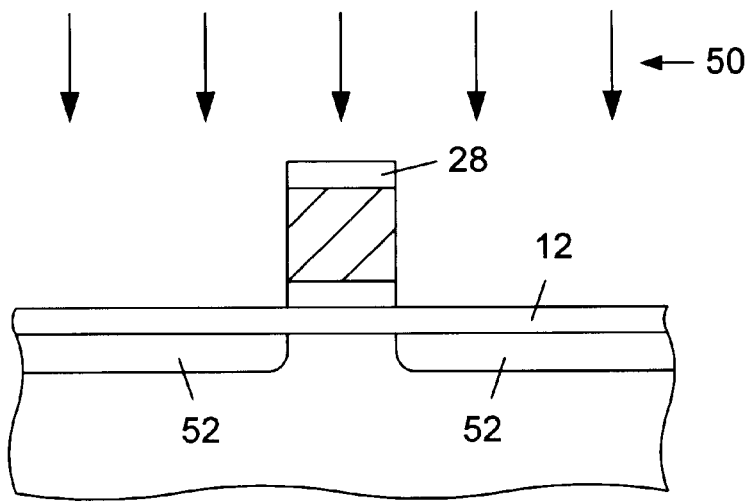
FIG. 13 is a partial cross-sectional view of the semiconductor topography subsequent to the step in FIG. 6 according to an alternate embodiment, wherein dopant species are implanted into the substrate to form lightly doped drain impurity areas aligned with sidewall surfaces of the gate conductor.
Figure 14:
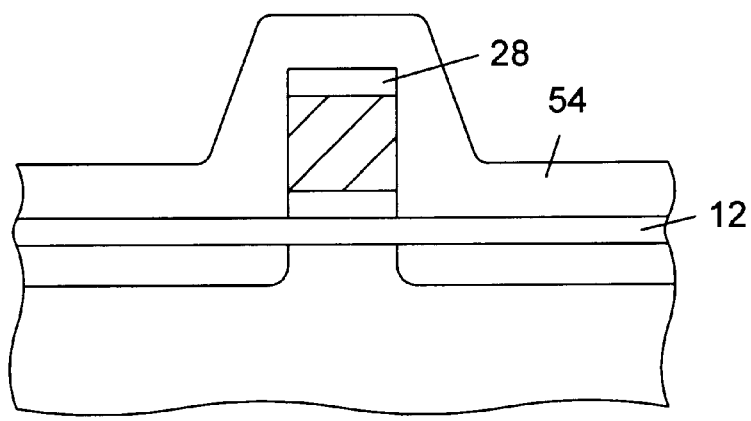
FIG. 14 is a partial cross-sectional view of the semiconductor topography subsequent to the step of FIG. 13, wherein a spacer material layer having etch characteristics substantially similar to etch characteristics of the gate dielectric layer and the masking layer is deposited across the semiconductor topography.
Figure 15:
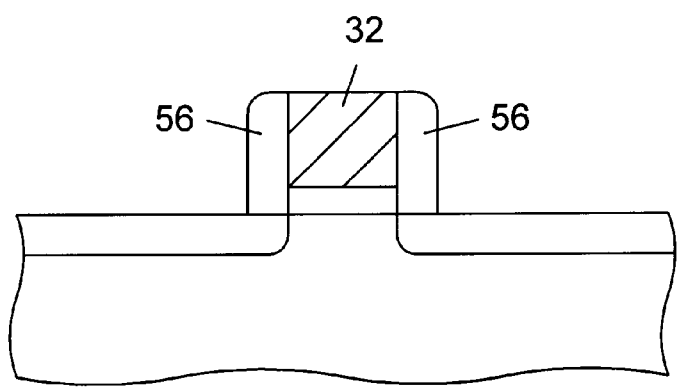
FIG. 15 is a partial cross-sectional view of the semiconductor topography subsequent to the step in FIG. 14, wherein sidewall spacers are formed upon opposed sidewall surfaces of the gate conductor substantially simultaneously with removal of the masking layer and portions of the gate dielectric layer.

According to a second embodiment of the invention, in a processing step subsequent to the step depicted in FIG. 6, an LDD implant 50 may be performed prior to removal of masking layer 28 and exposed portions of dielectric layer 12 to form lightly doped drain impurity areas 52, as shown in FIG. 13. A dielectric material 54 having etch characteristics substantially similar to etch characteristics of masking layer 28 and dielectric layer 12 may then be formed across the semiconductor topography, as shown in FIG. 14. Preferably, dielectric material 54 is silicon dioxide. Following formation of the dielectric layer, an isotropic etch may be used to remove portions of dielectric material 54 from horizontally oriented surfaces. The duration of the etch is preferably sufficient to remove masking layer 28 and portions of gate dielectric 12 not shielded by gate conductor 32 while retaining spacers 56 upon lateral surfaces of the gate conductor 32, as shown in FIG. 15.

Figure 16:
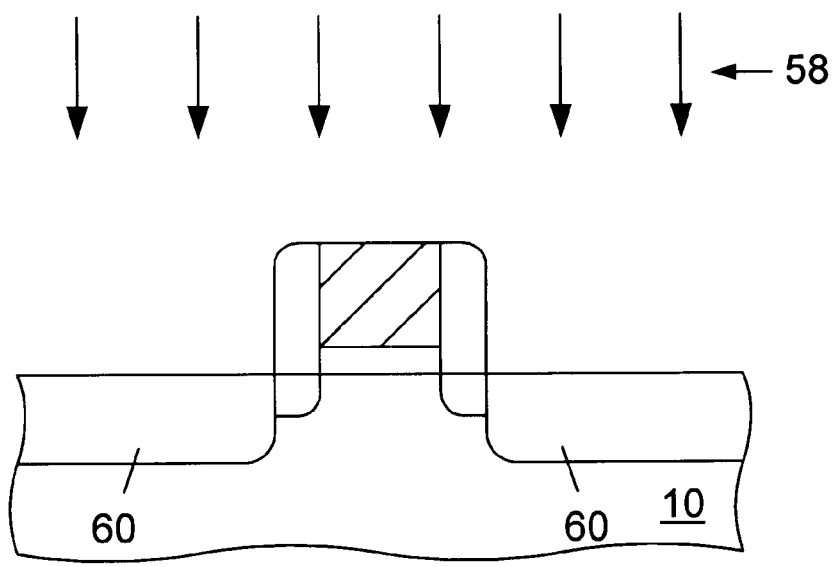
FIG. 16 is a partial cross-sectional view of the semiconductor topography subsequent to the step in FIG. 15, wherein another implant of dopant species which is self-aligned to the exposed lateral surfaces of the sidewall spacers is forwarded into the substrate to form source and drain impurity regions.
Figure 17:
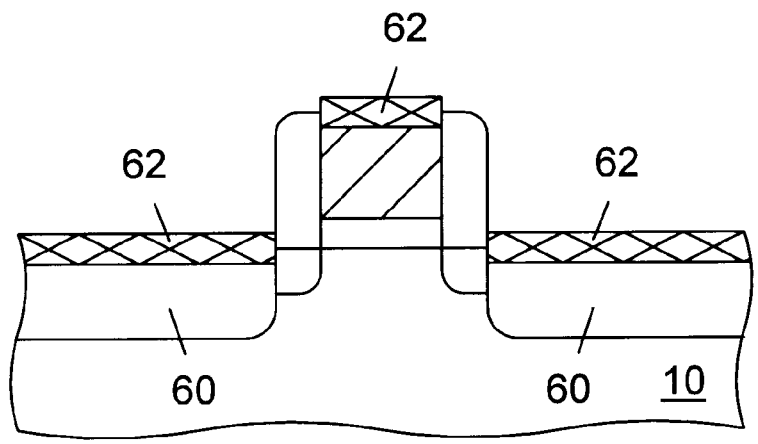
FIG. 17 is a partial cross-sectional view of the semiconductor topography subsequent to the step in FIG. 16, wherein metal silicide has been formed upon upper surfaces of the source and drain regions and the gate conductor.

Dopant species 58 (FIG. 16) may then be implanted at a relatively high dose and energy into portions of semiconductor substrate 10 not masked by the gate conductor or the spacers to form source and drain impurity areas 60. In an embodiment, a post-implant anneal using thermal radiation may be performed to activate and position the as-implanted impurities. As depicted in FIG. 17, self-aligned silicide "salicide" structures 62 have been formed upon source and drain regions 60 by reacting a refractory metal with the silicon surfaces of substrate 10.

Figure 18:
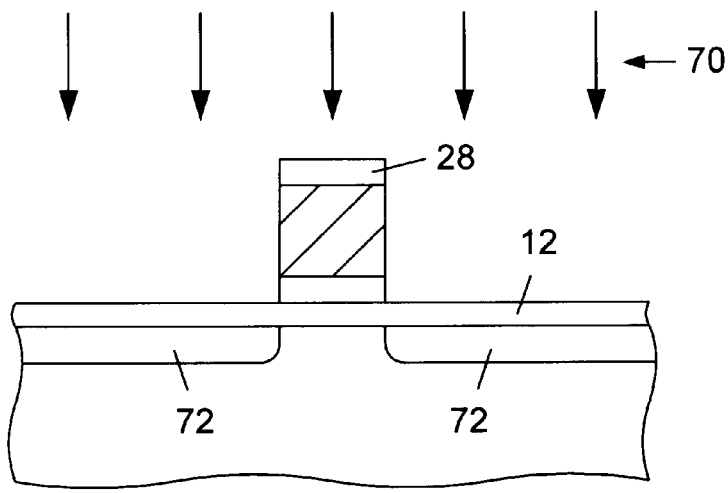
FIG. 18 is a partial cross-sectional view of the semiconductor topography subsequent to the step in FIG. 6 according to a further alternate embodiment, wherein dopant species are implanted into the substrate to form lightly doped drain impurity areas aligned with sidewall surfaces of the gate conductor.
Figure 19:
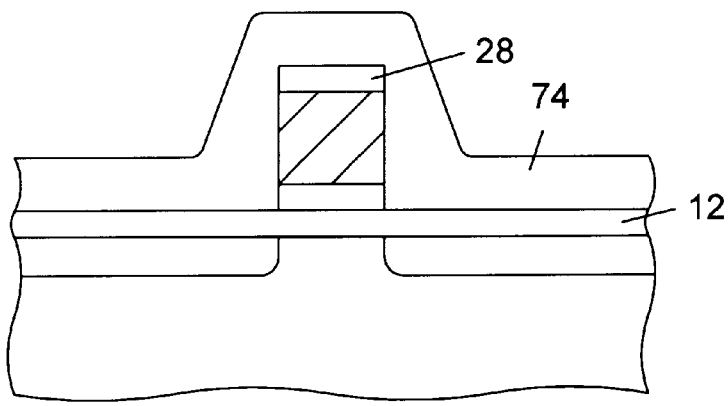
FIG. 19 is a partial cross-sectional view of the semiconductor topography subsequent to the step of FIG. 18, wherein a spacer material layer having etch characteristics substantially different from etch characteristics of the gate dielectric layer and the masking layer is deposited across the semiconductor topography.
Figure 20:
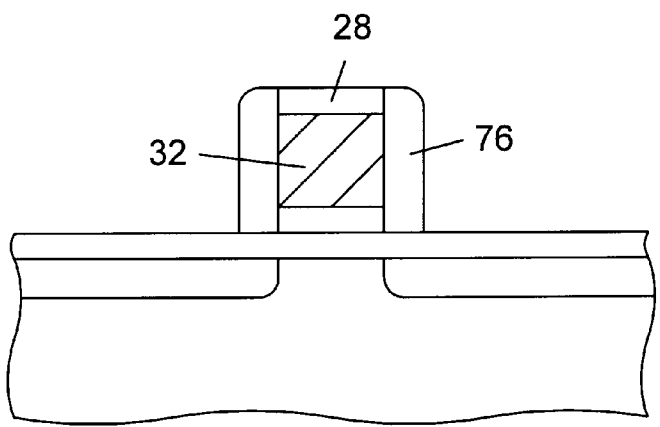
FIG. 20 is a partial cross-sectional view of the semiconductor topography subsequent to the step in FIG. 19, wherein sidewall spacers are formed upon opposed sidewall surfaces of the gate conductor.

According to a third embodiment of the invention, in a processing step subsequent to the step depicted in FIG. 6, an LDD implant 70 may be performed prior to removal of masking layer 28 and exposed portions of dielectric layer 12 to form lightly doped drain impurity areas 72, as shown in FIG. 18. A dielectric material 74 having etch characteristics substantially different from etch characteristics of masking layer 28 and dielectric layer 12 may then be formed across the semiconductor topography, as shown in FIG. 19. Dielectric material 74 may be any dielectric material that is etched preferentially to masking layer 28 and dielectric layer 12. For example, if masking layer 28 and dielectric layer 12 include silicon dioxide, dielectric material 74 may include silicon nitride. An isotropic etch may be used to remove portions of dielectric material 74 from horizontally oriented surfaces while retaining the dielectric material upon lateral surfaces of gate conductor 32 and masking layer 28 to form spacers 76, as shown in FIG. 20.

Figure 21A:
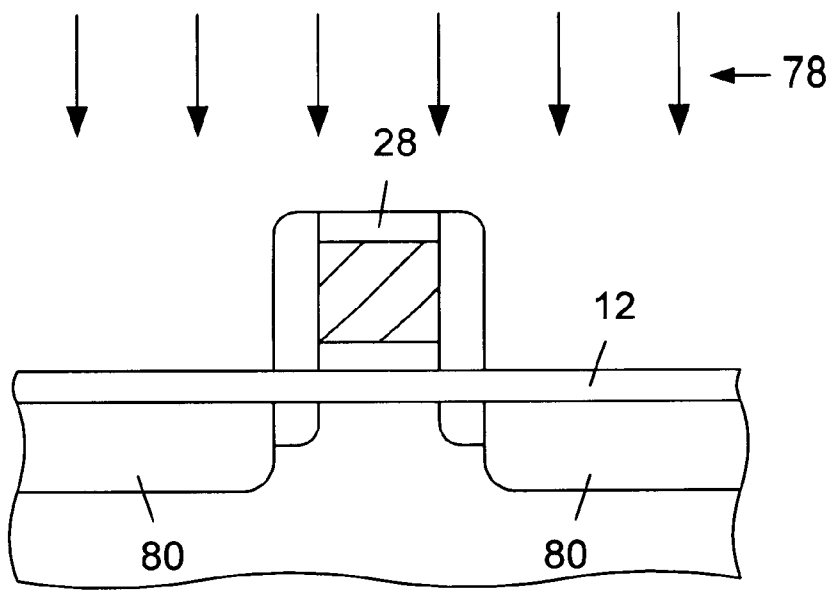
FIG. 21a is a partial cross-sectional view of the semiconductor topography subsequent to the step in FIG. 20, wherein another implant of dopant species which is self-aligned to the exposed lateral surfaces of the sidewall spacers is forwarded into the substrate to form source and drain impurity regions.
Figure 21B:
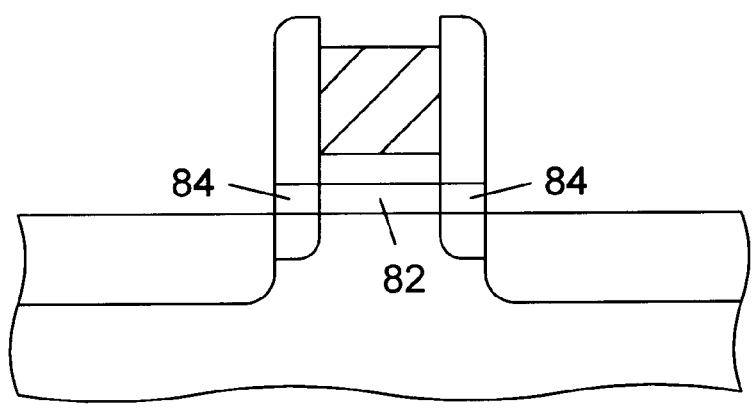
FIG. 21b is a partial cross-sectional view of the semiconductor topography subsequent to the step in FIG. 21a, wherein the masking layer and portion of the gate dielectric layer not masked by the gate conductor are removed.
Figure 22A:
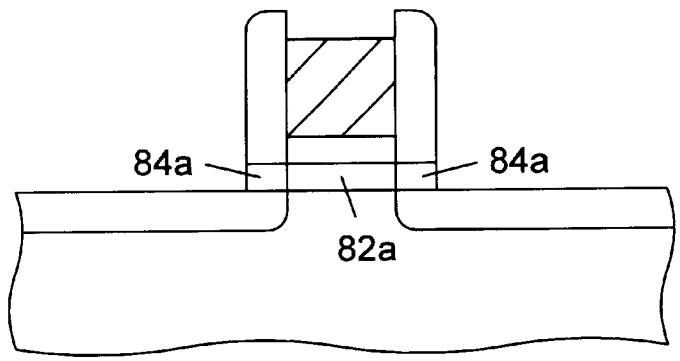
FIG. 22a is a partial cross-sectional view of the semiconductor topography subsequent to the step in FIG. 20 according to an alternate embodiment, wherein the masking layer and portion of the gate dielectric layer not masked by the gate conductor are removed.
Figure 22B:
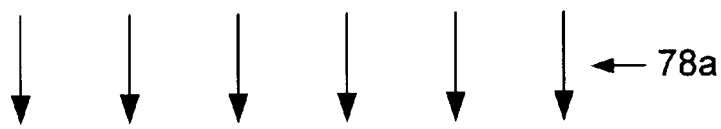
FIG. 22b is a partial cross-sectional view of the semiconductor topography subsequent to the step in FIG. 22a, wherein another implant of dopant species which is self-aligned to the exposed lateral surfaces of the sidewall spacers is forwarded into the substrate to form source and drain impurity regions.
Figure 22B:
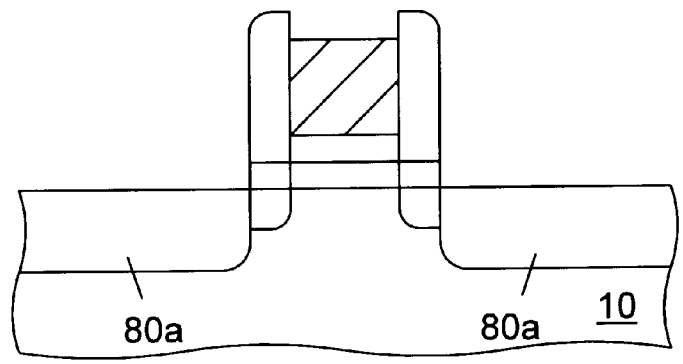
Figure 23:
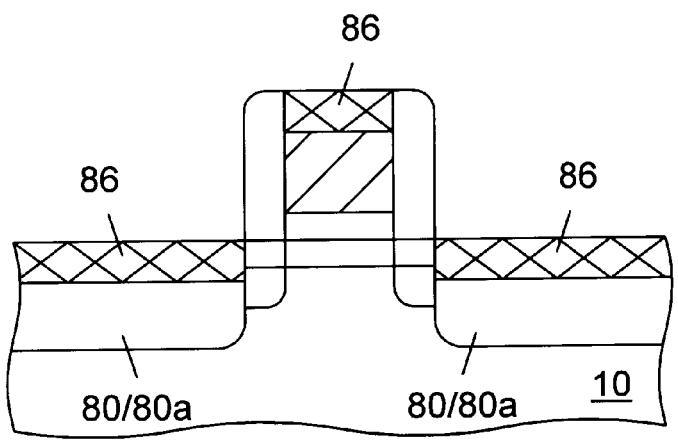
FIG. 23 is a partial cross-sectional view of the semiconductor topography subsequent to the step of either FIG. 21a or FIG. 22a, wherein metal silicide has been formed upon upper surfaces of the source and drain regions and the gate conductor.

Dopant species 78 (FIG. 21a) may then be implanted at a relatively high dose and energy into portions of semiconductor substrate 10 not masked by the gate conductor or the spacers to form source and drain impurity areas 80. A post-implant anneal using thermal radiation may be performed to activate and position the as-implanted impurities. An isotropic etch selective for masking material 28 and dielectric material 12 may then be used to remove the masking layer and those portions of the dielectric layer not shielded by the gate conductor or the spacers. The retained portions of dielectric material 12 will form gate dielectric 82 and spacer pads 84, as shown in FIG. 21b. Alternatively, the processing steps depicted in FIGS. 21a and 21b may be reversed. As such, the isotropic etch may be performed first, as shown in FIG. 22a, to form gate dielectric 82a and spacer pads 84a. Dopant species 78a may then be forwarded into semiconductor substrate 10 to form source and drain impurity areas 80a, as shown in FIG. 22b. As depicted in FIG. 23, self-aligned silicide "salicide" structures 86 have been formed upon source and drain regions 80/80a by reacting a refractory metal with the silicon surfaces of substrate 10.

It will be appreciated to those skilled in the art having the benefit of this disclosure that this invention is believed to provide a transistor having an ultra-narrow gate and a method for making such as transistor. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A semiconductor topography, comprising:

a gate dielectric arranged upon a semiconductor substrate;

a conductive gate layer arranged above the gate dielectric layer;

a patterning layer extending across a portion of said conductive gate layer and having an opening therein, wherein sidewall surfaces of said opening are substantially angled away from being perpendicular to an upper surface of said patterning layer; and a masking layer formed upon an upper surface of said conductive gate layer, wherein said masking layer extends substantially between the sidewall surfaces of said opening.

2. The semiconductor topography as recited in claim 1, wherein said conductive gate layer comprises a thickness substantially between about 1000 angstroms and about 1800 angstroms.

3. The semiconductor topography as recited in claim 1, wherein said patterning layer comprises a thickness substantially between about 500 angstroms and about 900 angstroms.

4. The semiconductor topography as recited in claim 1, wherein a width of said opening proximate said upper surface of said patterning layer is about 0.2 $\mu$m.

5. The semiconductor topography as recited in claim 1, wherein said sidewall surfaces extend substantially between an upper surface of said patterning layer and an upper surface of said conductive gate layer.

6. The semiconductor topography as recited in claim 5, wherein said a width of said opening proximate said upper surface of said conductive gate layer is substantially between approximately 0.04 $\mu$m and 0.1 $\mu$m.

7. The semiconductor topography as recited in claim 1, wherein said semiconductor substrate comprises single crystalline silicon.

8. The semiconductor topography as recited in claim 1, wherein said gate dielectric layer comprises silicon dioxide.

9. The semiconductor topography as recited in claim 1, wherein said patterning layer comprises a material having etch characteristics such that the patterning layer material is selectively removable while retaining the conductive gate layer.

10. The semiconductor topography as recited in claim 1, wherein said patterning layer comprises silicon nitride.

11. The semiconductor topography as recited in claim 1, wherein said masking layer comprises a thickness substantially between approximately 100 angstroms and approximately 300 angstroms.

12. The semiconductor topography as recited in claim 1, wherein said masking layer comprises silicon dioxide.

13. The semiconductor topography as recited in claim 1, wherein said gate dielectric is arranged upon said semiconductor substrate such that said gate dielectric extends beyond the lateral boundaries of said opening.

14. The semiconductor topography as recited in claim 13, wherein said conductive gate layer is arranged upon said gate dielectric layer such that said conductive gate layer extends beyond the lateral boundaries of said opening.

15. The semiconductor topography as recited in claim 1, wherein a portion of said gate dielectric layer is arranged directly below said opening and in contact with said semiconductor substrate.

* * * * *